United States Patent
Parimi et al.

(10) Patent No.: US 10,551,435 B1
(45) Date of Patent: Feb. 4, 2020

(54) 2D COMPRESSION-BASED LOW POWER ATPG

(71) Applicant: Cadence Design Systems, Inc., San Jose, CA (US)

(72) Inventors: Nitin Parimi, San Jose, CA (US); Krishna Vijaya Chakravadhanula, Vestal, NY (US); Patrick Wayne Gallagher, Apalachin, NY (US); Vivek Chickermane, Slaterville Springs, NY (US); Brian Edward Foutz, Charlottesville, VA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 333 days.

(21) Appl. No.: 15/163,351

(22) Filed: May 24, 2016

(51) Int. Cl.
| | | |
|---|---|---|
| *G01R 31/3177* | (2006.01) | |
| *G01R 31/317* | (2006.01) | |
| *G01R 31/3183* | (2006.01) | |
| *H03K 3/012* | (2006.01) | |
| *G01R 31/3185* | (2006.01) | |
| *H03K 19/096* | (2006.01) | |
| *G01R 31/3187* | (2006.01) | |
| *G11C 16/32* | (2006.01) | |

(52) U.S. Cl.
CPC ... *G01R 31/3177* (2013.01); *G01R 31/31727* (2013.01); *G01R 31/318307* (2013.01); *G01R 31/3187* (2013.01); *G01R 31/31721* (2013.01); *G01R 31/31725* (2013.01); *G01R 31/318541* (2013.01); *G01R 31/318552* (2013.01); *G01R 31/318575* (2013.01); *G11C 16/32* (2013.01); *H03K 3/012* (2013.01); *H03K 19/096* (2013.01)

(58) Field of Classification Search
CPC ........ G01R 31/318552; G01R 31/3177; G01R 31/318575; G01R 31/318541; G01R 31/31727; G01R 31/31725; G01R 31/3187; G01R 31/31721; G01R 31/2834; G01R 31/318307; H03K 3/012; H03K 19/096; G11C 16/32
See application file for complete search history.

(56) References Cited

U.S. PATENT DOCUMENTS

| | | | |
|---|---|---|---|
| 8,468,404 B1 * | 6/2013 | Chickermane | G01R 31/318575 714/726 |
| 9,097,765 B1 * | 8/2015 | Charlebois | G01R 31/3177 |
| 2007/0226565 A1 * | 9/2007 | Kudo | G01R 31/318552 714/731 |
| 2014/0095101 A1 | 4/2014 | Gizdarski | |
| 2014/0103985 A1 * | 4/2014 | Andreev | H03K 5/131 327/262 |

(Continued)

*Primary Examiner* — April Y Blair
*Assistant Examiner* — Sazzad Hossain
(74) *Attorney, Agent, or Firm* — Tarolli, Sundheim, Covell & Tummino LLP

(57) ABSTRACT

Systems and methods disclosed herein provide for an integrated circuit partitioned into a plurality of regions of a two-dimensional grid, wherein each region of the grid corresponds to similarly located scan flops. The systems and methods also provide for enabling clock gates to scan flops in some regions of the integrated circuit and disabling clock gates to other regions in order to better manage power dissipation during ATPG. Specifically, toggle disabling templates are applied during ATPG in order to enable clock gates in certain regions of the two-dimensional grid.

20 Claims, 9 Drawing Sheets

(56) References Cited

U.S. PATENT DOCUMENTS

2014/0281774 A1* 9/2014 Wohl ............. G01R 31/318547
    714/727
2015/0185286 A1* 7/2015 Sprague ........... G01R 31/31922
    714/744

* cited by examiner

2D COMPRESSION-BASED LOW POWER ATPG

TECHNICAL FIELD

The present application relates to systems and methods for optimizing power management during Automatic Test Pattern Generation ("ATPG").

CROSS-REFERENCE TO RELATED APPLICATIONS

This application is related to U.S. patent application Ser. No. 14/639,029, filed Mar. 4, 2015, entitled "Systems and Methods for Testing Integrated Circuit Designs," the disclosure of which is incorporated by reference herein in its entirety.

BACKGROUND

ATPG was developed to explicitly test each gate and path in an integrated circuit ("IC") design. As ICs have become larger and more complex, the amount of logic to be tested per input/output test pin has increased dramatically.

Test Compression is a technique used as part of a Design For Test ("DFT") method to reduce the time and cost of testing integrated circuits. Straightforward application of scan techniques can result in large vector sets with corresponding long tester time and memory requirements. Test Compression takes advantage of the small number of significant values (care bits) techniques to reduce test data and test time, by decompressing the scan input on chip and compressing the test output. This technique allows highly compressed test stimuli to be applied from low-pin count testers and compressed test responses to be measured.

Test mode power is one of many important test quality metrics considered during ATPG. For example, poorly managed power dissipation during test mode can (i) impact design performance and quality-of-test and (ii) may lead to IR drop issues and false failures on a tester. Scan-based manufacturing tests of low power designs often exceed the very tight functional constraints on average and instantaneous logic switching. For example, the logic activity during the shift and launch-capture of test pattern data may lead to excessive power dissipation and voltage droop. Specifically, a scan flop can be at a first value (e.g., "0" or "1") during the scan load but can capture another value (e.g., "1" or "0") during the capture cycle (i.e., once the functional clock is applied after scan shift). The captured values are generally dependent on the scan load values as well as the associated functional logic. Further, the captured values can be more random in 0/1 distribution than the scan load pattern. As such, reducing the switching activity between the shift and launch-capture of the test pattern data can contribute to reducing some of the power dissipation during ATPG as well.

Current solutions directed to reducing the switching activity and, therefore, achieving certain test power targets, are usually applied after ATPG generates the test patterns. Clock gating, for example, is commonly utilized to reduce functional power dissipation in the integrated circuit design. With clock gating, functional clocks are temporarily gated from reaching areas of the integrated circuit chip that are not required for functional operation at that time. Specifically, care bits required to temporarily gate the specific functional clocks (i.e., corresponding to flops that do not require functional operation) are merged with an already generated test pattern. In other words, the generated test patterns are "post-processed" with the merging care bits. However, "post-processing" presents other problems. For example, it is possible that certain "merging" care bits will be prevented from being post-processed into the generated test patterns because of conflicts with existing care bits (e.g., for fault detection) in the generated test pattern. As such, with an increase in the number of conflicts with existing care bits, the likelihood of achieving desired power targets for specific test patterns will decrease.

Furthermore, with regard to compressed test patterns, in order to better manage power dissipation during ATPG, it is also important to consider the physical locations of the scan channels in relation to the integrated circuit. Specifically, since test compression techniques result in a greater number of scan channels, the physical proximity of the scan channels might result in regions of increased thermal activity, e.g., "hot spots."

As such, there is a need for physically-aware systems and methods for optimizing the power dissipated during ATPG.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide physically-aware systems and methods for optimizing the power dissipated during ATPG. The methods and apparatuses herein address at least one of the ATPG problems described above. Accordingly, systems and methods of enabling clock gates to certain scan flops of an integrated circuit design are provided.

According to an embodiment, an automatic test pattern generation system includes: an integrated circuit partitioned into a plurality of regions, wherein each region includes a corresponding group of scan channels, wherein scan channels located in a similar physical region of the integrated circuit are grouped together; a plurality of clock gates, wherein each of the clock gates selectively controls a plurality of scan flops of the groups of scan channels; and a processor, wherein the processor is configured to (i) enable at least one clock gate of the plurality of clock gates to at least one scan flop of the plurality of scan flops and (ii) disable at least one other clock gate of the plurality of clock gates to at least one other scan flop of the plurality of scan flops.

Figure 1:
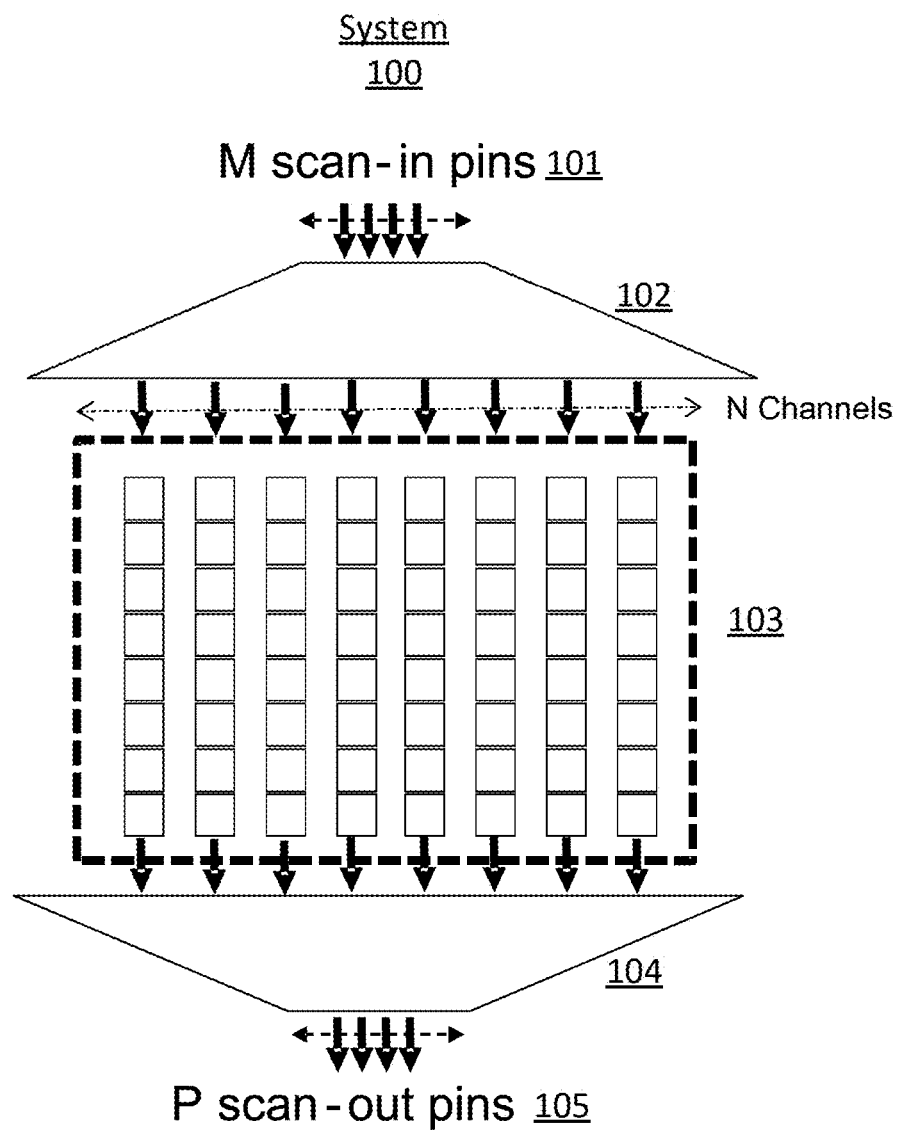
FIG. 1 illustrates elements of a test compression network system.

FIG. 1 illustrates elements of a test compression network system. System 100 includes M scan-in pins 101, decompressor network 102, test cube 103, compressor network 104 and P scan-out pins 105. The M scan-in pins 101 are fed data (e.g., scan data, etc.) from a storage volume (not shown). The M scan-in pins 101 feed the decompressor network 102. The decompressor network 102 (e.g., at least one of linear spreader network of XOR logic gates, Illinois scan/broadcast scan distribution network, a first-in, first-out ("FIFO") linear shift register, linear feedback shift register ("LFSR"), etc.) feeds the N internal scan channels of test cube 103. The tail-end of the N internal scan-channels are input to the compressor network 104 (e.g., linear compressing network of XOR logic gates, multiple input signature register ("MISR"), Hybrid (XOR logic gates and MISR), etc.). The output of the compressor network 104 is fed via the P scan-out pins 105 to a storage volume (not shown) for later comparison and analysis.

Figure 2:
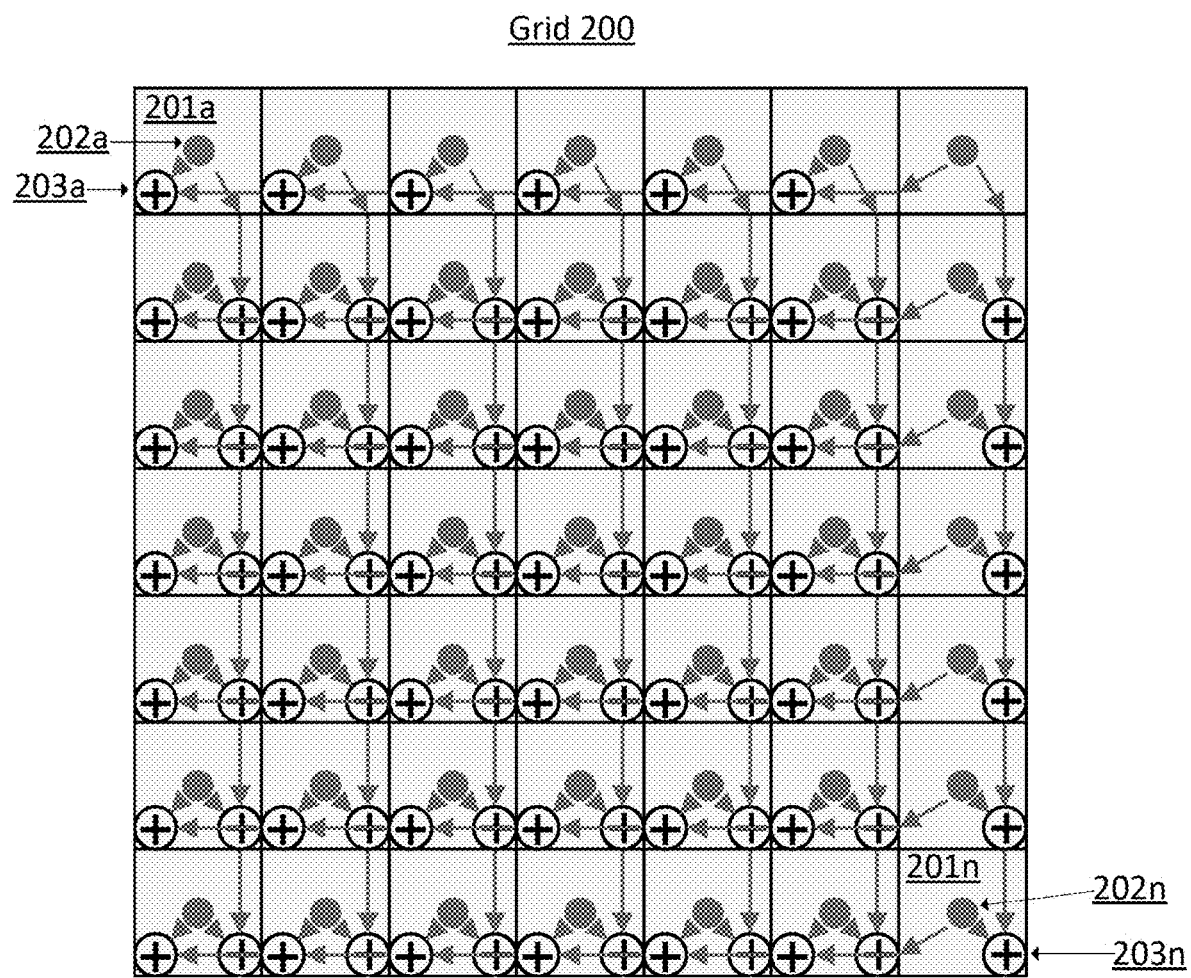
FIG. 2 illustrates an embodiment of an integrated circuit design partitioned into a 2-dimensional grid.

FIG. 2 illustrates an embodiment of an integrated circuit design partitioned into a 2-dimensional grid. In an embodiment, grid 200 includes partitioned regions 201a to 201n. Each region of the regions 201a to 201n includes a group of scan channels 202a to 202n, respectively. Further, each region of the regions 201a to 201n also corresponds to a compressor-decompressor ("CoDec") 203a to 203n. In an embodiment, partitioning the integrated circuit chip involves the association of a scan channel or a group of scan channels with an area of the integrated circuit chip. In an embodiment, scan channels located in the same physical region of the integrated circuit chip are grouped together. In an embodiment, the grid 200 partitions the scan channels of FIG. 2 into regions including the same number of scan channels per scan channel group. In another embodiment, the regions 201a to 201n include different numbers of scan channels per scan channel group. In an embodiment, the scan channels groups 202a to 202n may each be associated with a physically-distributed CoDec (e.g., 203a to 203n). In some embodiments, a CoDec may include only one of a decompressor network or a compressor network. In other embodiments, a CoDec may include both of the decompressor and compressor networks. Further, in an embodiment, (i) the scan channel heads of the scan channel groups 202a to 202n may be connected to the decompressor portion (not shown) of each of the CoDecs and (ii) the scan channel ends of the scan channel groups 202a to 202n may be connected to the compressor portion (not shown) of the CoDecs. In an embodiment, the scan channels of FIG. 2 correspond to the N internal scan channels of test cube 103 in FIG. 1. In other words, the scan channels in FIG. 2 are a partitioned representation of the scan channels of the test cube 103 in FIG. 1. Further, the decompressor and compressor portions of each of the physically-distributed CoDecs correspond to the decompressor network 102 and the compressor network 104 of FIG. 1, respectively. Further, a plurality of scan wires (not shown) may connect (i) scan-in pins (not shown) to the inputs of the decompressor portion of the CoDec and (ii) outputs of the compressor portion of the CoDec to the scan-out pins (not shown). In an embodiment, the CoDecs 203a to 203n can be physically located between the scan channels of each of the scan channel groups or proximally located next to the respective scan channel groups. In other words, the CoDecs may be conveniently positioned in each of the regions 201a to 201n so as to (i) reduce the wire length from each of the scan channels in the scan channel groups to the CoDecs as well as (ii) reduce the lengths of the plurality of scan wires. In an embodiment, scan channel groups from one region can be connected to CoDecs of another region. In an embodiment, the location of each of the scan channel groups (and, therefore, scan channels) in the regions may be stored in memory. Accordingly, in an embodiment, if an error is discovered, a tester may resolve in what area of the integrated circuit the error occurred. Based on the area the error occurred in, the tester may resolve the error down to one of the scan channel groups associated with that particular region. Further, the placement information for the scan channels is not limited to just error detection and may also be utilized for a variety of other purposes. Further detail regarding the 2-dimensional grid may be found in U.S. patent application Ser. No. 14/639,029, which is incorporated herein, in its entirety, by reference.

Figure 3A:
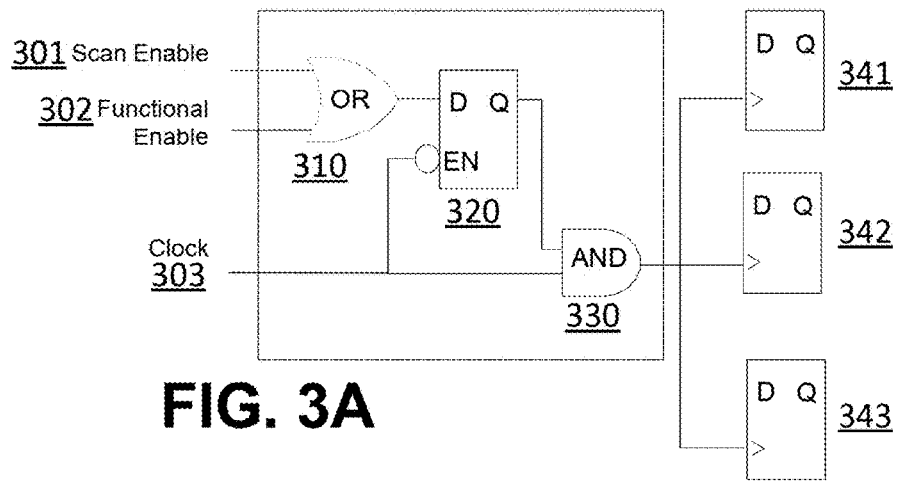
FIG. 3A illustrates an embodiment of a power-aware clock-gating scheme.

FIG. 3A illustrates an embodiment of a power-aware clock-gating scheme. System 300 includes a first logical OR gate 310, a flop 320, a logical AND gate 330 (i.e., clock gate), and scan flops 341, 342 and 343. The first logical OR gate 310 includes a scan enable input 301 and a functional enable input 302. The output of the first logical OR gate 310 feeds an input of flop 320. Further, a clock signal 303 is input to an enable pin of flop 320 as well as a first input of the logical AND gate 330. In an embodiment, clock 303 is inverted at the enable input of flop 320. The output of the flop 320 is input to a second input of the logical AND gate 330. The output of the logical AND gate 330 feeds the enable pins of scan flops 341, 342 and 343. In an embodiment, scan flops 341, 342 and 343 may be part of the same scan channel. In another embodiment, scan flops 341, 342 and 343 may be part of different scan channels. During scan shift, the scan enable signal at the first logical OR gate 310 overrides the clock gate and allows all scan flops 341, 342 and 343 to scan concurrently. For example, during scan shift, a logical "1" may be supplied to the scan enable input 301 and a logical "0" may be supplied to the function enable input 302. During the capture cycle, however, the scan enable signal is inactive and the clock gate is controlled from its functional enable (e.g., a logical "0" may be supplied to the scan enable input 301 and a logical "1" may be supplied to the function enable input 302). As such, the function enable signal can be selectively controlled during the capture cycle so as to enable or disable a clock signal, via the clock gate 330, to scan flops 341, 342 and 343.

Figure 3B:
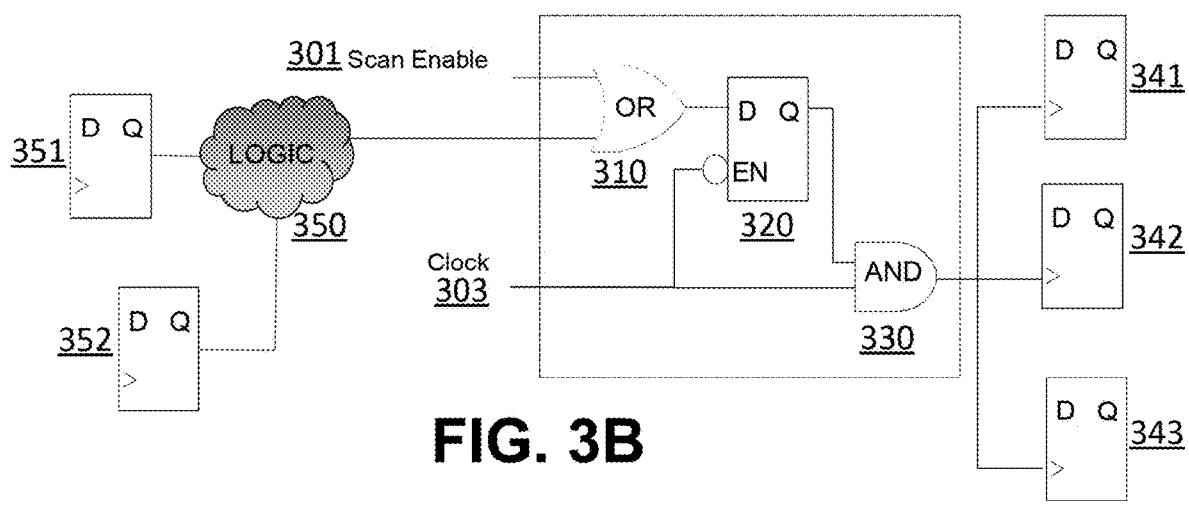
FIG. 3B illustrates another embodiment of a power-aware clock-gating scheme.

FIG. 3B illustrates another embodiment of a power-aware clock-gating scheme. FIG. 3B includes many of the same elements as FIG. 3A except instead of a function enable signal being supplied to the first logical OR gate 310, the output of logic 350 supplies a signal to the functional enable input of the first logical OR gate 310. As depicted in FIG. 3B, the outputs of scan flops 351 and 352 are fed to logic 350. As such, the output of logic 350 will dictate whether the clock signals to scan flops 341, 342 and 343 will be enabled or disabled via the clock gate 330. Accordingly, in order to selectively control the clock signal to scan flops 341-343, the output values of scan flops 351 and 352 need to be determined. In an embodiment, scan flops 351 and 352 may be part of the same scan channel as scan flops 341, 342 and 343. In another embodiment, scan flops 351 and 352 may be part of a different scan channel than scan flops 341, 342 and 343. Depending on the logic 350 between scan flops 351 and 352 and the first logical OR gate 310, care bits (i.e., corresponding to scan flops 351 and 352) for disabling (e.g., gating) the clock to scan flops 341-343, via the clock gate 330, are determined. As such, whenever the determined care bits are supplied to scan flops 351 and 352 during the capture cycle, the clock signal 303 to scan flops 341-343 will be disabled. Therefore, power will not be supplied to scan flops 341-343.

Figure 3C:
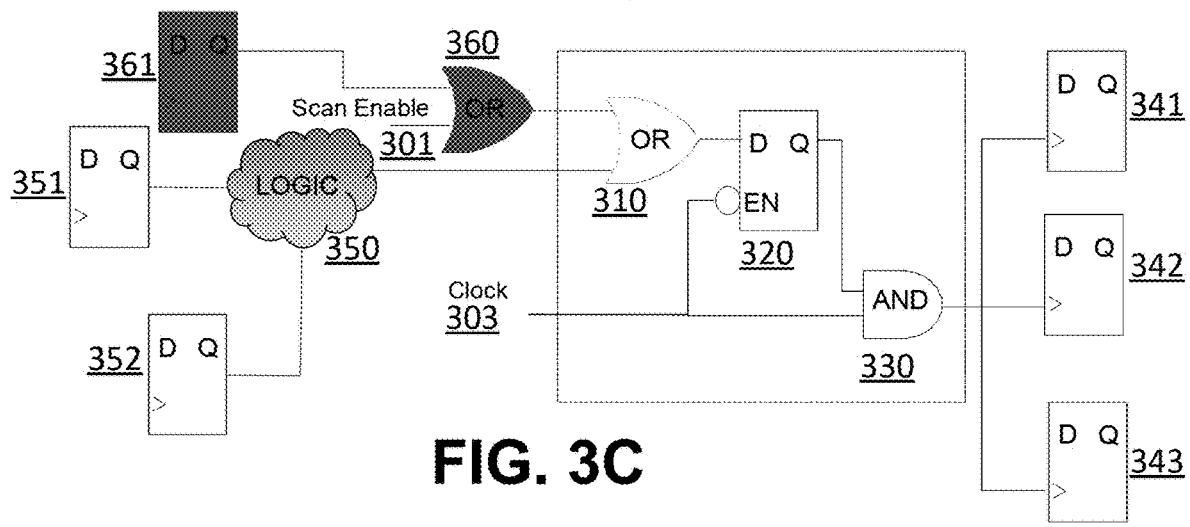
FIG. 3C illustrates another embodiment of a power-aware clock-gating scheme.

FIG. 3C illustrates another embodiment of a power-aware clock-gating scheme. FIG. 3C includes scan-flop control of the scan enable signal 301 in addition to many of the same elements as FIG. 3B. Specifically, an output of scan flop 361 is fed into a first input of a second logical OR gate 360. In an embodiment, scan flop 361 may be part of the same scan channel as scan flops 341, 342 and 343. In another embodiment, scan flop 361 may be part of a different scan channel than scan flops 341, 342 and 343. Further, the scan enable signal 301 is input to a second input of the second logical OR gate 360. Moreover, the output of logical gate 360 is fed into the first input of the first logical OR gate 310. As depicted in FIG. 3C, the output of scan flop 361 can control whether or not scan flops 341-343 receive the clock signal 303 regardless of the bits provided at scan flops 351 and 352 (i.e., the "function enable" control). For example, if a logical "1" is provided at scan flop 361, a logical "1" will also be provided to the second logical OR gate 360. As such, the second logical OR gate 360 will also output a logical "1" to the first logical OR gate 310. Further, the additional logic including the first logical OR gate 310, the flop gate 320 and the logical AND gate 330 will enable the clock signal 303 to scan flops 341-343.

Figure 4:
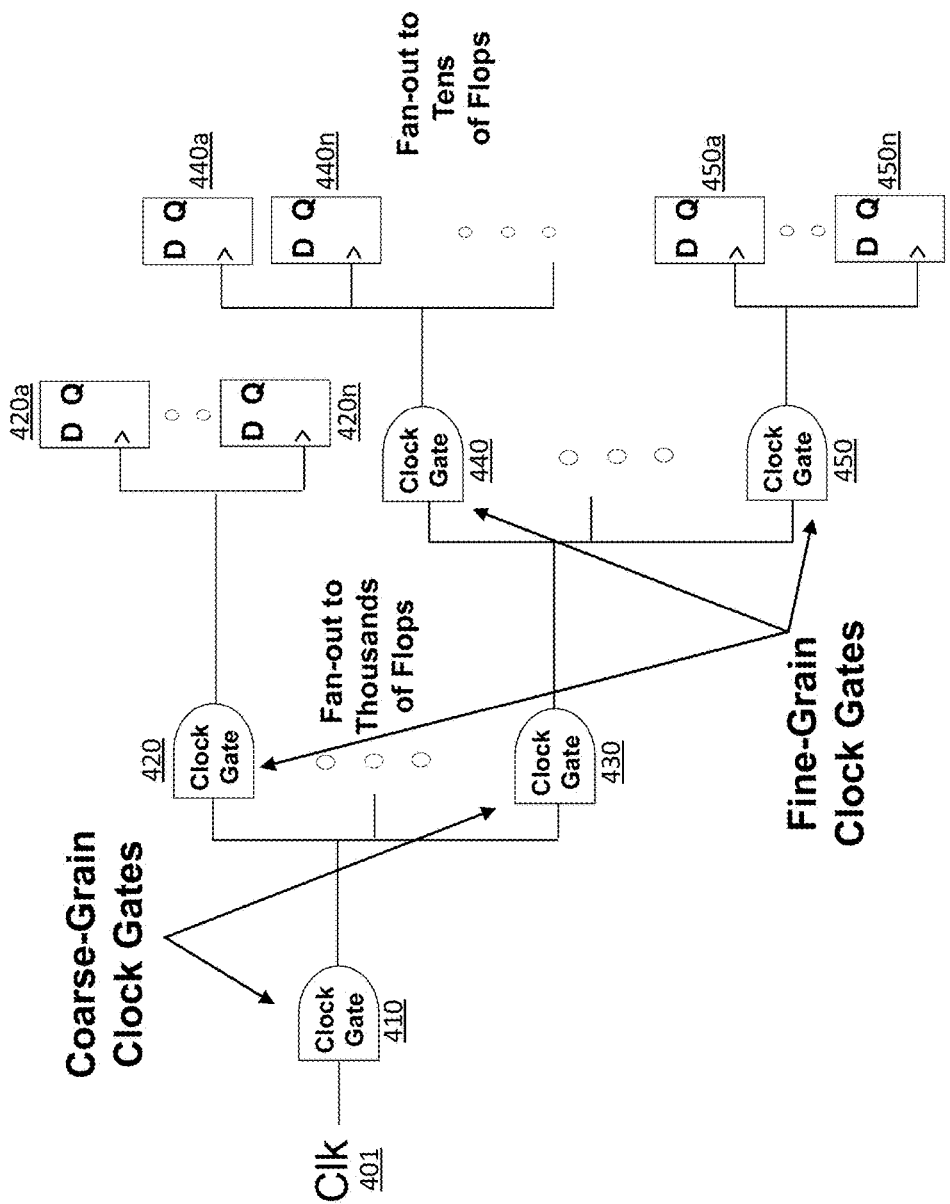
FIG. 4 illustrates an embodiment of fine-grain and coarse-grain clock gates.

FIG. 4 illustrates an embodiment of fine-grain and coarse-grain clock gates. In an embodiment, a coarse-grain clock gate may control thousands of scan flops and a fine-grain clock gate may control only tens of flops. For example, as depicted in FIG. 4, a coarse-grain clock gate 410 (which receives a clock signal Clk 401) fans out to thousands of scan flops as well as clock gates 420 and 430. Clock gate 430 is also a coarse-grain clock gate and, thus, fans out to thousands of scan flops as well. Clock gate 430 also fans out to clock gates 440 and 450. As depicted in FIG. 4, clock gates 420, 440 and 450 are fine-grain clock gates and, therefore, each fan out to only tens of scan flops. For example, clock gate 420 fans out to scan flops 420a-420n; clock gate 440 fans out to scan flops 440a-440n; and clock gate 450 fans out to scan flops 450a-450n. In an embodiment, using the granularity (i.e., coarse-grain or fine-grain) of the clock gates, thousands of scan flops can be prevented from switching during the capture phase based on only a few care bits (not shown) used to control only a few clock gates. For example, if clock gate 410 is disabled, all of the scan flops dependent on the clock gate 410, either directly or indirectly (e.g., via other clock gates), will be disabled as well and, thus, prevented from switching.

Figure 5A:
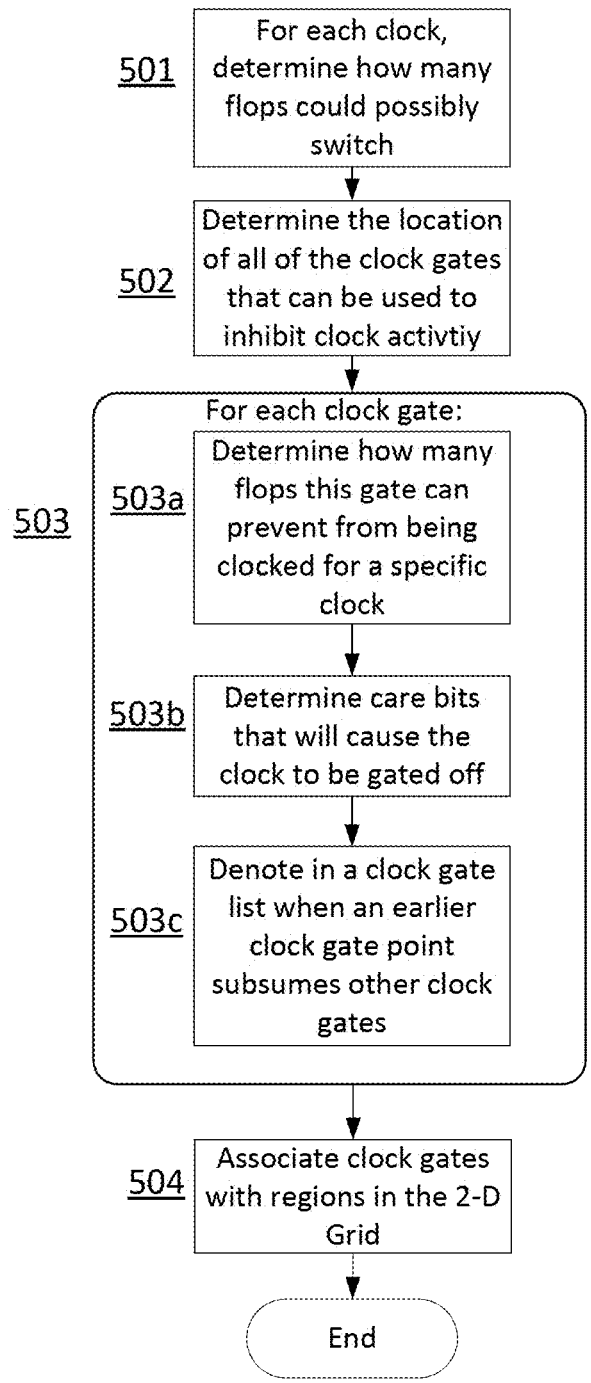
FIG. 5A illustrates an embodiment of a method of associating clock gates with specific regions in the 2-dimensional grid.

FIG. 5A illustrates an embodiment of a method of associating clock gates with specific regions in the 2-dimensional grid (e.g., grid 200 of FIG. 2). In an embodiment, the following method may be performed by the ATPG. In step 501, for each clock, it is first determined how many scan flops could possibly switch if that clock is pulsed. In other words, it is determined how many scan flops are controlled (e.g., enabled or disabled) by each clock. Then, in step 502, the location of all of the clock gates that can be used to inhibit clock activity to scan flops is identified. In an embodiment, each of the identified clocks gates is flagged along the determined clock path (e.g., as determined in step 501). Further, in addition to flagging the identified clock gates, a list of the identified clock gates is also created. Then, as depicted by step 503, for each of the identified clock gates: (i) in step 503a, it is determined how many scan flops the identified clock gate can control; (ii) in step 503b, the care bits required to enable the clock gate (e.g., disable the clock to the associated scan flops) is determined; and (iii) in step 503c, it is denoted in the clock gate list whenever an earlier clock gate appears and, therefore, subsumes at least one other clock gate. As such, among the information associated with each clock gate and root clock in the design is: the number of scan flops controlled directly and via child clock gates, the child clock gates controlled and the care bits required to gate off the clock at the clock gate. In another embodiment, the process of identifying the clock gates involves tracing from the clock pin of each of the scan flops in the design back to the clock gates. As each clock gate is encountered during the tracing, information is stored about the number of flops controlled by the clock gate. For designs having both coarse-grain and fine-grain clock gating, there could be multiple clock gates before the root clock is reached. Such information about the clock gate hierarchy is stored as well. Accordingly, the next time a child clock gate is seen; there will not be a need to travel up the hierarchy again since such information was already stored. Lastly, in step 504, the identified clock gates are associated with the stored information corresponding to the locations of the scan channels of scan channel groups 202a-202n (and, therefore, regions 201a-201n) in grid 200 of FIG. 2. Specifically, the scan flops controlled by each of the identified clocks gates are associated with specific scan channels of scan channel groups 202a-202n in FIG. 2. As such, by enabling certain clock gates (i.e., disabling the clocks to the corresponding scan flops), specific regions of the grid 200 can be activated or deactivated (i.e., gated) during the capture cycle.

Figure 5B:
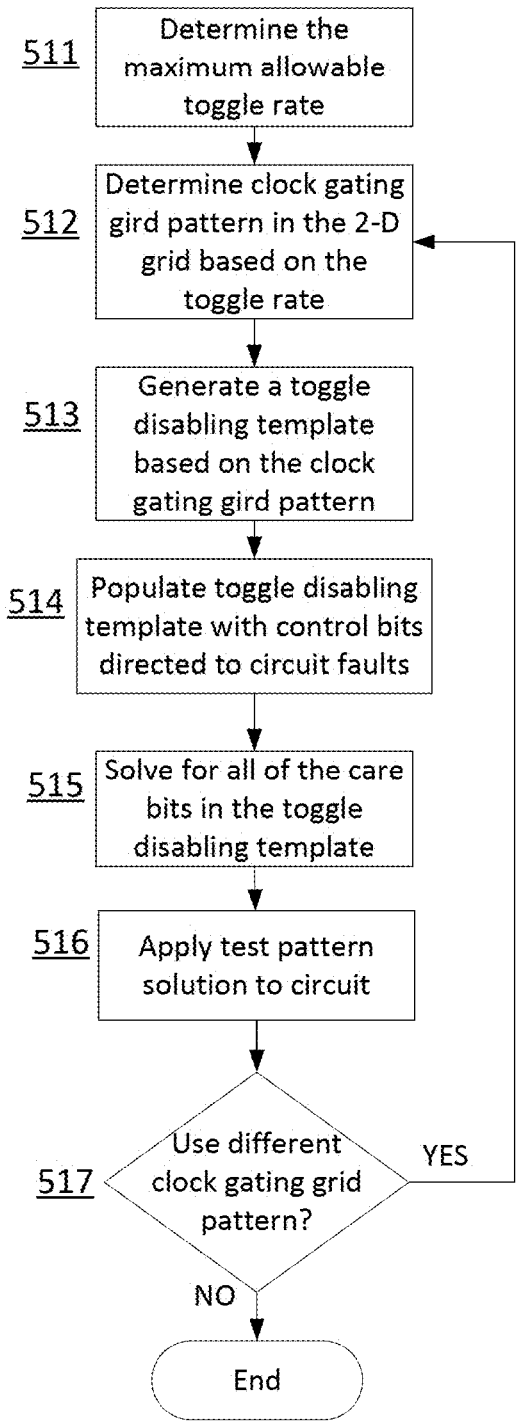
FIG. 5B illustrates an embodiment of a method of gating specific regions in the 2-dimensional grid during ATPG.

FIG. 5B illustrates an embodiment of a method of gating specific regions in the 2-dimensional grid during ATPG. In step 511, the maximum allowable toggle rate is determined. In an embodiment, the maximum allowable toggle rate specifies the maximum percentage of scan flops in a circuit design "allowed to switch" (e.g., due to specified power constraints) on any clock pulse. In other words, the toggle rate controls the switching activity between the shift and launch-capture of the test pattern data. As such, based on the determined toggle rate, a corresponding power target (e.g., associated with a desired power dissipation during ATPG)

can be achieved. Then, in step 512, based on the determined toggle rate, a clock-gating grid pattern for the 2-dimensional grid is determined. In an embodiment, due to the presence of coarse-grain and fine-grain clock gates, a plurality of different clock-gating grid patterns can be utilized in the 2-dimensional grid in order to satisfy the toggle rate. Specifically, a variety of patterns of scan flops in scan channel groups 202a-202n can be set to specific values in the grid 200 in order to set the controlling clock gate to its disabling value and, thereby, prevent the scan flops fed by those clock gates from toggling during the capture phase. Then, based on the determined clock-gating grid pattern, in step 513, at least one toggle disabling template may be generated. In an embodiment, the toggle disabling template includes the aforementioned specific values (e.g., to set the controlling clock gate(s) to its disabling value). For example, in order to prevent scan flops 341, 342 and 343 of FIG. 3C from toggling, the clock signal feeding the scan flops (e.g., clock 303) has to be turned off. As such, the controlling clock gate, e.g., clock gate 330, has to be enabled. Accordingly, both of the inputs of the first logical OR gate 310 have to be at a logical "0," which in turn requires specific values (e.g., 0, 1, 0) at the scan flops controlling the clock gate, e.g., scan flops 351, 352 and 361. In an embodiment, the toggle disabling template may be extracted by an automatic tool or specified by a user. Then, in step 514, the toggle disabling template is populated with any other care bits required for fault detection. In an embodiment, the care bits required for fault detection only populate those bits that are designated as "don't care" (i.e., X's) in the toggle disabling template. Further, in an embodiment, ATPG can generate a fault-based subset on a specific clock or cone of logic in the toggle disabling template. As such, because the toggle disabling template can target a unique cone of logic, a reduced ATPG run time can be achieved. Then, in step 515, an equation solver solves for the care bits in the toggle disabling template (i.e., clock gate care bits and care bits directed to fault detection) and generates a plurality of test pattern solutions (i.e., with ATPG). Then, in step 516, the test pattern solutions are applied to the circuit to test for faults. For example, in an embodiment, a test pattern solution may be fed via the decompressor portions of CoDecs 203a-203n to the scan channels of scan groups 202a-202n of the grid 200 in FIG. 2. In an embodiment, the test pattern solution, when loaded onto the scan flops of the scan channels, enables a clock to one portion of scan flops in the grid 200 and disables the clock (i.e., gates the clock off) to the other portion of scan flops. Therefore, by disabling the clock to a number of scan flops, the power dissipation during test mode can be reduced. Further, in an embodiment, if any faults are detected during the application of a test pattern, a diagnostic tool can examine the tester failure and use the toggle-disabling template to more precisely determine the area of the grid 200 (and, thereby, the location of the scan flops) at which the faults occurred. However, for those scan flops not receiving a clock, they will also not be observed during the capture cycle of the test. In other words, any potential faults corresponding to the portion of the scan flops with the gated-off clocks will not be observed. As such, in order to make up for the loss of coverage corresponding to a certain clock-gating grid pattern, in step 517 it is determined whether another clock-gating grid pattern should be used. If it is decided that another clock-gating grid pattern should be used, the method then proceeds to step 512 but with a different clock-gating grid pattern, otherwise the method ends. In an embodiment, a different clock-gating grid pattern can be applied sequentially until full (or nearly full) fault coverage is achieved. In an embodiment, each of the different clock-gating grid patterns can target faults based on a unique cone of logic. Further, in another embodiment, a first clock-gating grid pattern and at least the second clock-gating grid pattern can be processed simultaneously as long as (i) the first and the at least second clock-gating grid pattern correspond to different cones of logic and (ii) the toggle disabling templates for the first and the at least second clock-gating grid pattern do not include conflicting care bits. In other words, if one of the specific values (e.g., at the scan flops controlling the clock gate) included in a first toggle disabling template (e.g., a logical "0" at scan flop 351) conflicts with a specific value included in at least a second toggle disabling template (e.g., a logical "1" at scan flop 351), the toggle disabling templates would be incompatible and therefore, could not be simultaneously processed. In an embodiment, the first and the at least second clock-gating grid patterns may be processed by one of (i) the same processor or (ii) different processors.

Figure 6A:
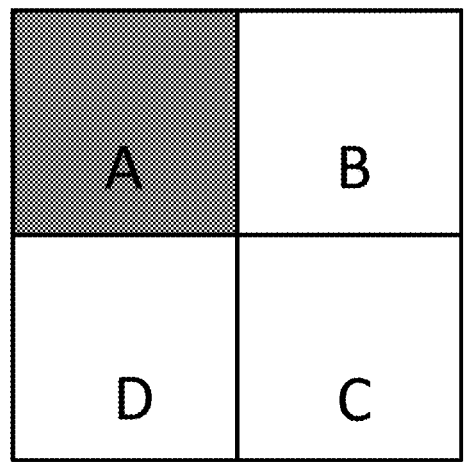
FIG. 6A illustrates an embodiment of an integrated circuit design partitioned into four regions.

FIG. 6A illustrates an embodiment of a circuit design partitioned into four regions. As depicted in FIG. 6A, the circuit design is partitioned into regions A, B, C and D. In an embodiment, assuming that the desired toggle rate is 25% and the clock-gating grid pattern only enables the clocks to region A, then only the scan flops in region A will be enabled during the capture phase. However, because all of the enabled scan flops are located in one region, there is a greater probability that region A will includes areas of high-power density or "thermal hot spots." As such, even with a lower toggle rate, the power management for the clock-gating grid pattern of FIG. 6A can still run inefficiently since much of the energy may be dissipated as heat.

Figure 6B:
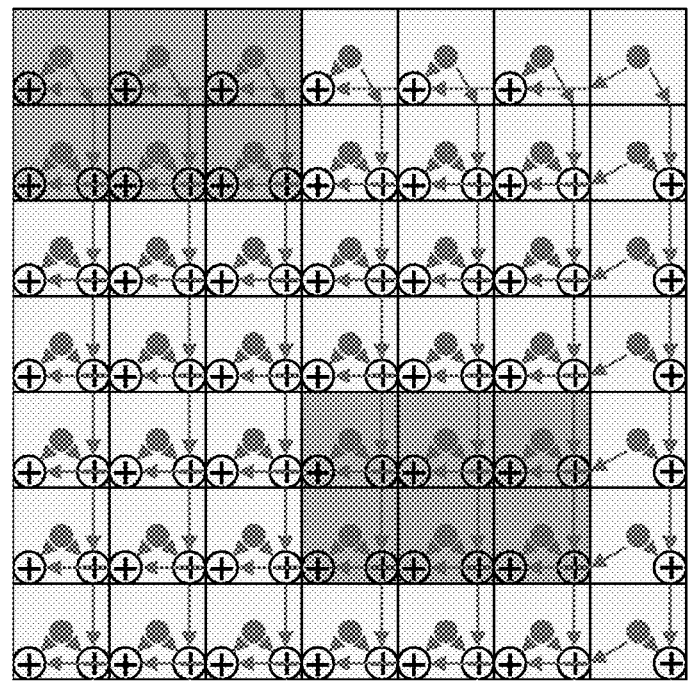
FIG. 6B illustrates an embodiment of a partitioned integrated circuit design with 25% of the flops enabled at a first level of clock-gate granularity.

FIG. 6B illustrates an embodiment of a partitioned circuit design with 25% of the flops enabled at a first level of clock-gate granularity. As opposed to FIG. 6A, which concentrates the enabled clocks into one quadrant of the grid, the enabled clocks in FIG. 6B are distributed evenly across the grid. As such, there is less of a likelihood of thermal hot spots arising in the shaded regions in FIG. 6B than the quadrant in FIG. 6A. In an embodiment, the distribution of the enabled clocks (i.e., the shaded regions) corresponds to a higher level of granularity than what is depicted in FIG. 6A. In other words, more fine-grain clock gates were utilized in order to enable the clocks to the scan flops in the shaded regions of FIG. 6B.

Figure 6C:
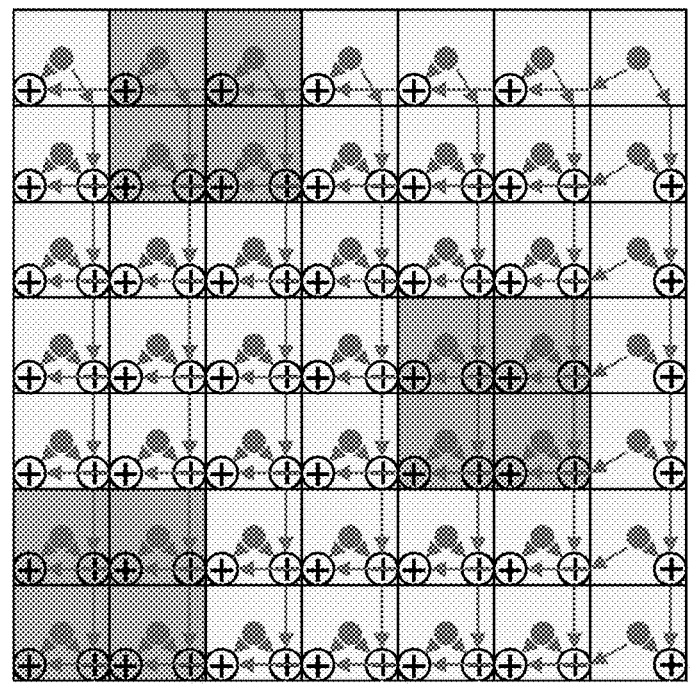
FIG. 6C illustrates an embodiment of a partitioned integrated circuit design with 25% of the flops enabled at a second level of clock-gate granularity.

FIG. 6C illustrates an embodiment of a partitioned circuit design with 25% of the flops enabled at a second level of clock-gate granularity. In an embodiment, the distribution of the enabled clocks (i.e., the shaded regions) in FIG. 6C corresponds to a higher level of granularity than what is depicted in FIG. 6B. In other words, more fine-grain clock gates were utilized in order to enable the clocks to the scan flops in the shaded regions of FIG. 6C. As such, there is less of a likelihood of thermal hot spots arising in the shaded regions in FIG. 6C than the shaded regions in FIG. 6B.

Figure 6D:
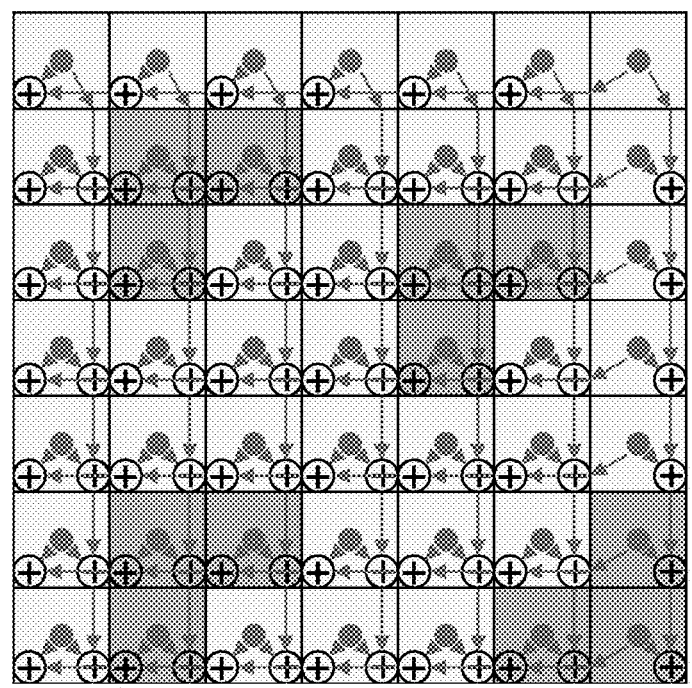
FIG. 6D illustrates an embodiment of a partitioned integrated circuit design with 25% of the flops enabled at a third level of clock-gate granularity.

FIG. 6D illustrates an embodiment of a partitioned circuit design with 25% of the flops enabled at a third level of clock-gate granularity. In an embodiment, the distribution of the enabled clocks (i.e., the shaded regions) in FIG. 6D corresponds to a higher level of granularity than what is depicted in FIG. 6C. In other words, more fine-grain clock gates were utilized in order to enable the clocks to the scan flops in the shaded regions of FIG. 6C. As such, there is less of a likelihood of thermal hot spots arising in the shaded regions in FIG. 6D than the shaded regions in FIG. 6C.

Figures 6E, 7A, 7B:
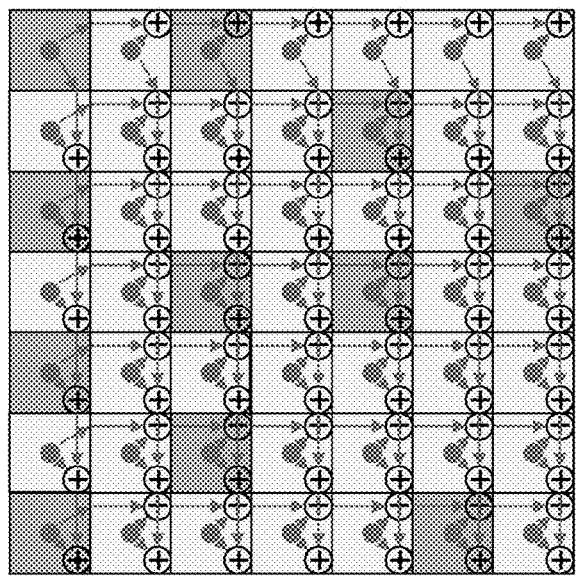
FIG. 6E illustrates an embodiment of a partitioned integrated circuit design with 25% of the flops enabled at a fourth level of clock-gate granularity.
FIG. 7A illustrates an embodiment of a toggle disabling template corresponding to FIG. 6B.
FIG. 7B illustrates an embodiment of a toggle disabling template corresponding to FIG. 6E.

FIG. 6E illustrates an embodiment of a partitioned circuit design with 25% of the flops enabled at a fourth level of clock-gate granularity. In an embodiment, the distribution of the enabled clocks (i.e., the shaded regions) in FIG. 6E corresponds to a higher level of granularity than what is depicted in FIG. 6D. In other words, more fine-grain clock gates were utilized in order to enable the clocks to the scan flops in the shaded regions of FIG. 6D. As such, there is less of a likelihood of thermal hot spots arising in the shaded regions in FIG. 6E than the shaded regions in FIG. 6D.

FIG. 7A illustrates an embodiment of a toggle disabling template corresponding to FIG. 6B. In an embodiment, the toggle disabling template contains the care bits (i.e., Os and is) that ensure that the scan flops of the shaded regions in FIG. 6B are able to toggle during the capture phase. In an embodiment, the bits in toggle disabling template correspond to all of the scan flops in the circuit design. Further, the shaded bits (e.g., X, 0, 1, X and 1) denote those scan flops that are also clock gate control bits. In other words, the clock gate control bits correspond to the scan flops that control whether the clock gate is enabled or disabled. In an embodiment, clock gate control bits that are not needed to be at a value (i.e., 0 or 1) to shut off (i.e., enable) the desired clock gates are left as X's (i.e., don't care bits). In an embodiment, all of the don't care bits (X's) in the toggle disabling template will be filled in during the test generation process by care bits (and other values) targeting circuit faults in the shaded regions of FIG. 6B. Further, as depicted in FIG. 7A, in order to enable the clocks in the shaded regions of the FIG. 6B, only five clock gate control bits (three of which are care bits) are required.

FIG. 7B illustrates an embodiment of a toggle disabling template corresponding to FIG. 6E. As depicted in FIG. 7B, because FIG. 6E includes a higher level of clock gate granularity (and, therefore, more clock gates), the toggle disabling template in FIG. 7B requires a higher number of clock gate control bits. For example, in contrast to the toggle disabling template of FIG. 7A, the toggle disabling template of FIG. 7B includes seven clock gate control bits (five of which are care bits).

The description of the foregoing embodiments may refer to algorithms, sequences, macros, and operations that require processor execution of instructions stored in memory. The processor may be specific to an apparatus, such as automated test equipment (ATE). The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EE-PROM), flash memory, and yet other storage such as magnetic or optical cards, or any type of media that stores program instructions. Each of the memory devices implemented in the apparatus is further connected to or coupled to a system bus or a network connection, wired or unwired, capable of facilitating or driving communications.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. An automatic test pattern generation system, the system comprising:
   an integrated circuit partitioned into a plurality of regions of a two-dimensional grid, wherein each region of the two-dimensional grid includes a corresponding group of scan channels and at least one distinct compressor-decompressor ("CoDec"), wherein scan channels located in a similar physical region of the integrated circuit are grouped together;
   a plurality of clock gates arranged in a hierarchy comprising:
   a set of fine grain control clock gates, wherein each fine grain control clock gate of the set of fine grain control clock gates controls a corresponding plurality of scan flops; and
   a set of coarse grain control clock gates, wherein each coarse grain control clock gate of the set of coarse grain control clock gates controls two or more fine grain control clock gates of the set of fine grain control clock gates and a corresponding plurality of the scan flops;
   a processor, wherein the processor is configured to (i) enable a first clock gate of the plurality of clock gates that controls a first set of the scan flops in a first region of the plurality of regions and (ii) disable a second clock gate of the plurality of clocks that controls a second set of the scan flops in a second region of the plurality of regions, wherein the first clock gate is enabled and the second clock gate is disabled during a given capture cycle.

2. The system of claim 1, wherein (i) the enabling of the first clock gate prevents a clock from being transmitted to the at least one scan flop and (ii) the disabling of the second clock gate permits the clock to be transmitted to the at least one other scan flop.

3. The system of claim 2, wherein the first clock gate of the plurality of clock gates is enabled to prevent the at least one scan flop from switching during a capture phase of a test of the integrated circuit.

4. The system of claim 1, wherein the the first clock gate and the second clock gate are each one of a fine-grain clock gate and a coarse-grain clock gate, wherein (i) the fine-grain clock gate selectively controls tens of scan flops and (ii) the coarse-grain clock gate selectively controls thousands of scan flops.

5. The system of claim 1, wherein the at first clock gate and the second clock gate are each controlled by a plurality of other scan flops.

6. The system of claim 5, wherein the plurality of scan flops and the plurality of other scan flops are (i) part of a same scan channel or (ii) part of different scan channels.

7. The system of claim 1, wherein the CoDec includes at least one of a compressor network and a decompressor network.

8. The system of claim 7, wherein (i) the decompressor network is at least one of a linear spreader network of XOR logic gates, a broadcast scan distribution network, a linear shift register, and a linear feedback shift register and (ii) the compressor network is one of a linear compressing network of XOR logic gates and a multiple input signature register ("MISR").

9. An automatic test pattern generation method, the method comprising:
receiving, by a processor, a desired toggle rate;
calculating the number of scan flops controlled by each clock gate of a plurality of clock gates arranged in a hierarchy comprising:
a set of fine grain control clock gates, wherein each fine grain control clock gate of the set of fine grain control clock gates controls a corresponding plurality of scan flops; and
a set of coarse grain control clock gates, wherein each coarse grain control clock gate of the set of coarse grain control clock gates controls two or more fine grain control clock gates of the set of fine grain control clock gates and a corresponding plurality of the scan flops;
identifying a set of scan flops controlled by each clock gate of the plurality of clock gates arranged in a hierarchy;
determining, by the processor, a clock-gating grid pattern for an integrated circuit partitioned into a plurality of regions of a two-dimensional grid based on the desired toggle rate, wherein the clock-gating grid pattern corresponds to (i) enabling a first clock gate of the plurality of clock gates that controls a first set of the scan flops in at least a first region of the two-dimensional grid and (ii) disabling a second clock gate of the plurality of clocks that controls a second set of the scan flops in at least a second region of the two-dimensional grid such that the enabling and disabling occur during a given capture cycle, wherein each region of the two-dimensional grid includes at least one distinct compressor-decompressor; and
generating, by the processor, at least one test pattern based on the clock-gating grid pattern.

10. The method of claim 9, wherein (i) the enabling of the first clock gate prevents a clock from being transmitted to the at least one scan flop and (ii) the disabling of the second permits the clock to be transmitted to the at least one other scan flop.

11. The method of claim 10, further comprising: testing, with the processor, the at least one test pattern on the integrated circuit.

12. The method of claim 11, wherein the desired toggle rate corresponds to at least one of (i) switching activity of a plurality of scan flops between a scan load phase and a capture phase of the testing and (ii) a desired power dissipation during the testing.

13. The method of claim 12, wherein at least one clock gate is enabled during the capture phase.

14. The method of claim 9, further comprising:
generating, with the processor, a toggle disabling template based on the clock-gating grid pattern, wherein the toggle disabling template includes at least one care bit to selectively enable the at least one clock gate to the at least one scan flop in the at least first region of the integrated circuit;
populating, with the processor, the toggle disabling template with at least one other care bit, wherein the at least one other care bit is directed to detecting faults in the integrated circuit; and
solving, with the processor, for the at least one care bit and the at least one other care bit, wherein a solution is included in the at least one generated test pattern.

15. The method of claim 11, further comprising:
upon detecting at least one fault in the integrated circuit as a result of the test, determining, with the processor, a location of at least one scan flop at which the at least one fault occurred.

16. The method of claim 9, further comprising:
determining, by the processor, a second clock-gating grid pattern based on the desired toggle rate;
generating, by the processor, at least a second test pattern based on the second clock-gating grid pattern; and
testing, with the processor, the at least one test pattern and the at least second test pattern simultaneously on the integrated circuit, wherein the at least one test pattern and the at least second test pattern correspond to different cones of logic associated with the integrated circuit.

17. A non-transitory computer readable medium containing program instructions for an automatic test pattern generation system, wherein execution of the program instructions by one or more processors of a computer system causes one or more processors to perform the following:
receive a desired toggle rate;
calculate the number of scan flops controlled by each clock gate of a plurality of clock gates arranged in a hierarchy comprising:
a set of fine grain control clock gates, wherein each fine grain control clock gate of the set of fine grain control clock gates controls a corresponding plurality of scan flops; and
a set of coarse grain control clock gates, wherein each coarse grain control clock gate of the set of coarse grain control clock gates controls two or more fine grain control clock gates of the set of fine grain control clock gates and a corresponding plurality of then scan flops;
identify a set of scan flops controlled by each clock gate of the plurality of clock gates arranged in a hierarchy;
determine a clock-gating grid pattern for an integrated circuit partitioned into a plurality of regions of a two-dimensional grid based on the desired toggle rate, wherein the clock-gating grid pattern corresponds to (i) enabling a first clock gate of the plurality of clock gates that controls a first set of the scan flops in at least a first region of the two-dimensional grid and (ii) disabling a second clock gate of the plurality of clocks that controls a second set of the scan flops in at least a second region of the two-dimensional grid such that the enabling and disabling occur during a given capture cycle, wherein each region of the two-dimensional grid includes at least one distinct compressor-decompressor; and
generate at least one test pattern based on the clock-gating grid pattern.

18. The non-transitory computer readable medium of claim 17, wherein execution of the program instructions by one or more processors of a computer system further causes one or more processors to perform the following:
test the at least one test pattern on the integrated circuit.

19. The non-transitory computer readable medium of claim 17, wherein execution of the program instructions by one or more processors of a computer system further causes one or more processors to perform the following:
generate a toggle disabling template based on the clock-gating grid pattern, wherein the toggle disabling template includes at least one care bit to selectively enable the first clock gate to the at least one scan flop in the at least first region of the integrated circuit;

populate the toggle disabling template with at least one other care bit, wherein the at least one other care bit is directed to detecting faults in the integrated circuit; and solve for the at least one care bit and the at least one other care bit, wherein a solution is included in the at least one generated test pattern.

20. The non-transitory computer readable medium of claim 17, wherein execution of the program instructions by one or more processors of a computer system further causes one or more processors to perform the following:

determine a second clock-gating grid pattern based on the desired toggle rate;

generate at least a second test pattern based on the second clock-gating grid pattern; and test the at least one test pattern and the at least second test pattern simultaneously on the integrated circuit, wherein the at least one test pattern and the at least second test pattern correspond to different cones of logic associated with the integrated circuit.

* * * * *